United States Patent [19]

Pfennings

[11] Patent Number: 4,849,943
[45] Date of Patent: Jul. 18, 1989

[54] INTEGRATED MEMORY CIRCUIT HAVING A BLOCK SELECTION CIRCUIT

[75] Inventor: Leonardus C. M. G. Pfennings, Eindhoven, Netherlands

[73] Assignee: U.S. Philips Corp., New York, N.Y.

[21] Appl. No.: 77,154

[22] Filed: Jul. 24, 1987

[30] Foreign Application Priority Data

Aug. 27, 1986 [NL] Netherlands ............... 8602178

[51] Int. Cl.[4] .................. G11C 8/00; G11C 5/02
[52] U.S. Cl. ................... 365/230.03; 365/51; 365/230.06
[58] Field of Search ............ 365/189, 230, 233, 51

[56] References Cited

U.S. PATENT DOCUMENTS 4,723,229 2/1988 Hartgring et al. ............ 365/230
4,729,118 3/1988 Gelsomini .................. 365/230

Primary Examiner—Joseph A. Popek
Assistant Examiner—Andrew L. Sniezek
Attorney, Agent, or Firm—Steven R. Biren

[57] ABSTRACT

Memory cells in an integrated memory circuit are arranged in blocks and selected by block selection gates. This method of activation offers the advantage that the memory cells are accessed faster and that the power consumption is lower than in a memory which is not subdivided into blocks, because only a small group of memory cells is activated per selection operation. A block selection circuit is provided in which selection gates of two neighboring rows of memory cells have one common transistor. As a result of the multiple use of contact areas and the use of a mirror-symmetrical architecture, the lay-out can make optimum use of the available substrate surface area.

9 Claims, 3 Drawing Sheets

INTEGRATED MEMORY CIRCUIT HAVING A BLOCK SELECTION CIRCUIT

BACKGROUND OF THE INVENTION

The invention relates to an integrated memory circuit which includes a plurality of memory blocks with memory cells which are arranged in rows and columns, the memory cells which are arranged in a column being selectable via a column selection line, the memory cells of various memory blocks which are arranged in a row being selectable via a row selection line, a row of memory cells in a memory block being activatable via a logic row selection gate whereto a row selection signal and a block selection signal are applied.

A memory circuit of this kind is known from ISSCC, Digest of Technical Papers, February 1983, pp. 58–59. The subdivision of a memory into memory blocks with block selection (in the row direction and/or the column direction) is particularly advantageous for memories having a capacity of 128 kb and more (256 kb etc.). As a memory is made larger, the effect of the capacitance of the bit lines and the word lines will be greater. The charging and discharging of these lines will then be slower. This problem is avoided by subdividing a memory into blocks with selective activation per block. In the known circuit the block selection signal BS and the row selection signal RS are applied to an AND-gate for the selection of a row of memory cells in a memory block. In practice an AND-gate is realized by connecting an inverting amplifier to the output of an inverting AND-gate, so that the circuit becomes large (6 transistors) and slow (due to two gate delays). Another possibility would consist of the selection of a row in a memory block by means of an inverting OR-gate which then receives the inverted block selection signal $\overline{BS}$ and the inverted row selection signal $\overline{RS}$. In the case of CMOS transistors this solution again leads to a slower block selection circuit, because the PMOS transistors must be made wider in order to realize the same power supply as for the AND-gate, so that the input capacitances become higher. The inverting OR-gate switches quickly, but more time will be required for charging these input capacitances. For example, in a 256 kb memory, the block selection signal $\overline{BS}$ activates a number of 256 (or 512, 1024, depending on the organization of the memory) block selection circuits in parallel.

SUMMARY OF THE INVENTION

It is an object of the invention to realize faster access to a row of memory cells in a memory block.

To achieve this, an integrated memory circuit in accordance with the invention is characterized in that a row selection gate comprises at least three transistors, a first main electrode of a frirst transistor being connected to a first supply source terminal, a second main electrode of said first transistor being connected to a first main electrode of a second transistor, a second main electrode of said second transistor being connected to a first main electrode of a third transistor, a second main electrode of said third transistor being connected to a second supply source terminal, the gate of said second transistor receiving the row selection signal, said first and third transistors being of a different conductivity type and receiving the block selection signal on their gates, a group selection line for activating a row of memory cells in a block being connected to the junction of said second and third transistors, two logic row selection gates for two neighboring rows of memory cells within the same memory block having a common first transistor.

The preferred embodiment of an integrated memory circuit with CMOS transistors in accordance with the invention is characterized in that a row selection gate comprises a fourth transistor whose main electrodes are connected to those of the third transistor in the relevant row selection gate, the fourth transistor being of the NMOS type and having its gate connected to the gate of the second transistor in the relevant row selection gate.

Some advantages of this embodiment are that fewer transistors per gate are required in comparison with the AND-gates and OR-gates described above, that the gates can be simply connected to a $V_{DD}$ supply line and also in that two rows of memory cells can be powered by means of one supply line $V_{DD}$, which results in a smaller lay-out. Said fourth transistor provides faster access to the memory circuit, as will be described hereinafter.

BRIEF DESCRIPTION OF THE DRAWING

The invention will be described in detail hereinafter with reference to the accompanying diagrammatic drawings in which.

DETAILED DESCRIPTION OF THE PREFERRED EMBODIMENTS

Figure 1:
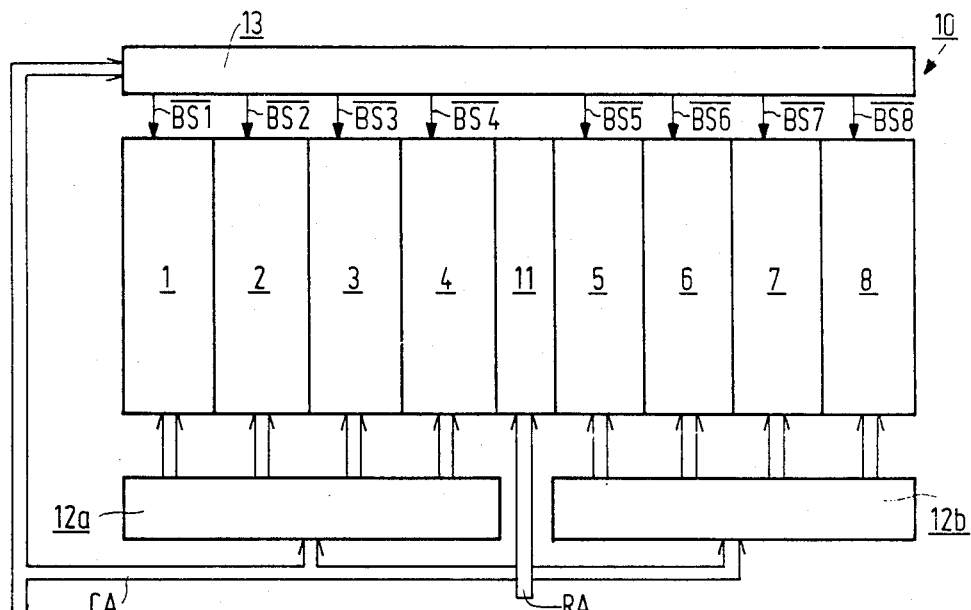
FIG. 1 shows a memory circuit incorporating block selection in with the invention.

FIG. 1 shows a memory circuit 10 whose memory section is subdivided into eight memory blocks 1 to 8. Each memory block comprises memory cells which are arranged in rows and columns and which can be selected by means of a column address CA and a row address RA. The row address is applied to a row decoding circuit 11, and a first part of the column address CA is applied to column address circuits 12a and 12b. The remainder of the column address CA is applied to a block selection circuit 13, a memory cell in a memory block being selectable by means of the address CA and RA, as will be explained hereinafter. As appears from FIG. 1, a memory cell is selected by means of the row and column decoding circuits 11, 12a and 12b, and also by means of the block selection circuits 13 which apply the block selection signals BS1 to BS8 to the memory blocks 1 to 8, respectively. The meaning of such addressing in a memory circuit will be described with reference to FIG. 2.

Figure 2:
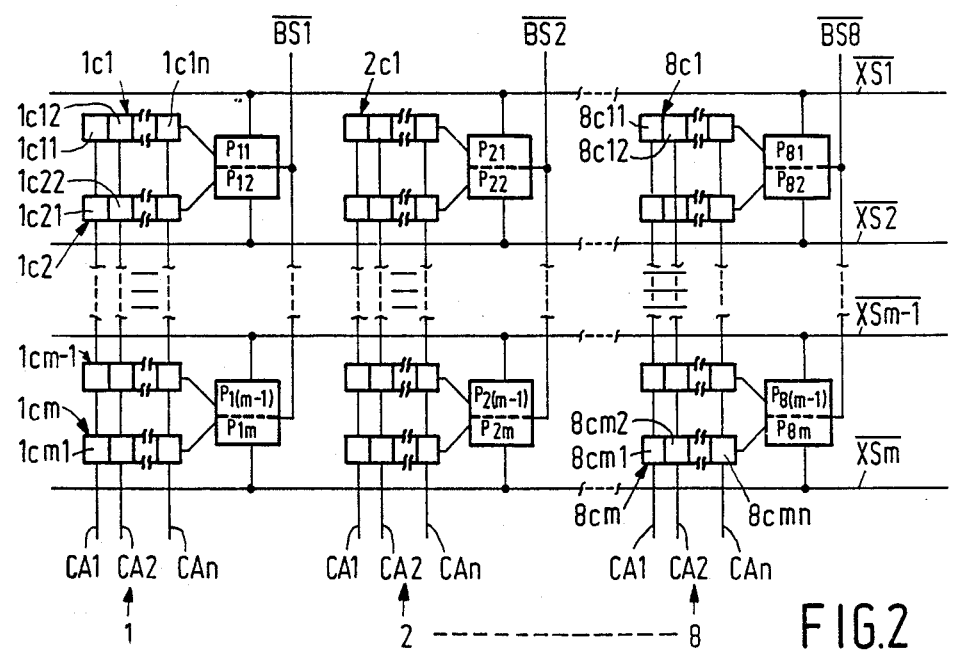
FIG. 2 shows a detail of a memory block as shown in FIG. 1.
Figure 3:
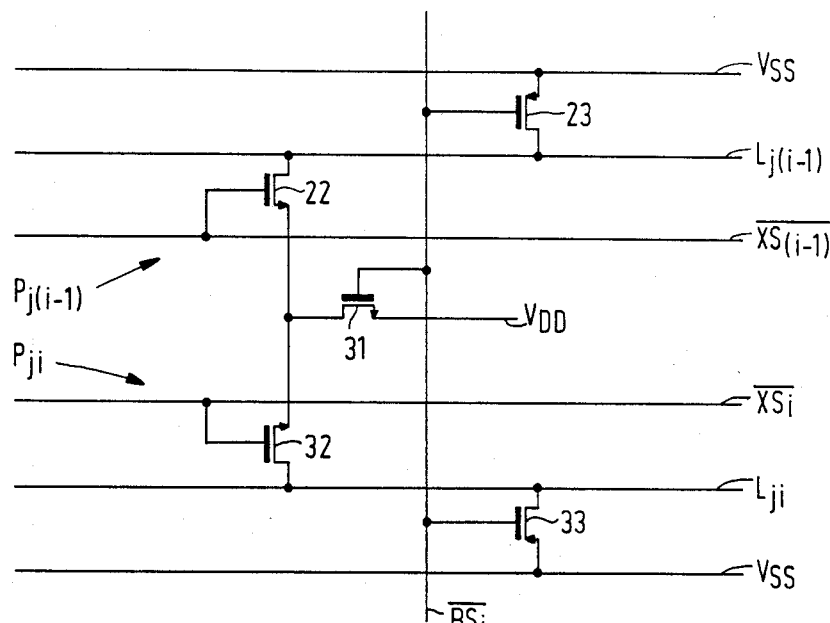
FIG. 3 shows two gate circuits comprising one common transistor for a memory block as shown in FIG. 2.

FIG. 2 shows a detail of the memory circuit of FIG. 1. The memory blocks 1, 2 to 8 are shown; in each memory block the rows and columns of memory cells are shown. In block 1, the row 1 of memory cells is denoted by the reference 1c1. The first cell of this row is denoted as 1c11, the second cell as 1c12, etc. The same code is used for the cells and rows in the further memory blocks. A memory cell in a block is selected as follows: via the column lines CA1 or CA2 or ... CAn, one column in each block is activated. The lines CA1 in each block can be driven by the same circuit, but can alternatively be driven by a separate buffer. The selection of a row of memory cells in a block is performed by means of a selection gate P which receives a row selection signal via the row selection line XS1 or XS2 or ... XSm for this purpose. Hereinafter, the same notation will be used for a signal and its supply line. The selection gate P in the memory block j ($1 \leq j \leq 8$) and in the row i of the memory block j is denoted as Pji. Furthermore, the inverted block selection signal $\overline{BSj}$ is applied to the selection gate Pji. Because the row selection circuit $\overline{XSi}$ need not activate all memory cells of all rows 1ci, 2ci, ... 8ci ($1 \leq i \leq m$), but only a number of (eight) selection gates P, essentially faster activation of a row i in a block j and a lower power consumption are achieved. Because the memory comprises a large number of such logic selection gates P, i.e. one gate per row per memory block, the surface area of these selection gates should not be (excessively) large. According to the present state of the art, these gates are formed by AND-gates composed of six transistors in CMOS technology. This gate circuit requires a large integration surface area. A selection gate in an integrated memory circuit in accordance with the invention, however, requires a much smaller surface area and comprises substantially fewer transistors as shown in FIG. 3. FIG. 3 shows two gate circuits in accordance with the invention which comprise one common transistor. The two row selection gates Pj(i−1) and Pji activate the row (i−1) and the row i, respectively, in the memory block j. The row selection gate Pji comprises three transistors 31, 32 and 33 which are connected in series between the supply voltages $V_{DD}$ and $V_{SS}$. The transistor 33 is an NMOS transistor and the transistors 31 and 32 are PMOS transistors. The row selection signal $\overline{XSi}$ is applied to the gate of the transistor 32 and the block selection signal $\overline{BSj}$ is applied to the gates of the transistors 31 and 33. The group selection line Lji is connected to the junction of the transistors 32 and 33. It will be apparent that the group selection line Lji, activating the row i in a block j, carries a high signal when the signal $\overline{BSj}$ is low and the signal $\overline{XSi}$ is low. The signal on the group selection line Lji is low when the signal $\overline{BSj}$ is high.

The row selection gate Pj(i−1) is formed by a series connection of the same PMOS transistor 31, the PMOS transistor 22 and the NMOS transistor 23 between supply voltage $V_{DD}$ and $V_{SS}$, the row selection XS(i−1) applied to the gate of the transistor 22 while the block selection signal $\overline{BSj}$ is applied to the gate of the transistor 23. The group selection line Lj(i−1) is connected to the junction of the transistors 22 and 23. The group selection line Lj(i−1) carries a high signal when $\overline{BSj}$ and XS(i−1) are both low. When $\overline{BSj}$ is high, Lj(i−1) is discharged and carries a low signal.

This construction offers the advantages that one PMOS transistor is saved for every two row selection gates and that two neighboring rows of memory cells in the present lay-out are powered via one voltage line, so that the lay-out becomes smaller and, moreover, the transistor 31 is simply connected to the voltage line $V_{DD}$, as will be described in detail hereinafter.

Figure 4:
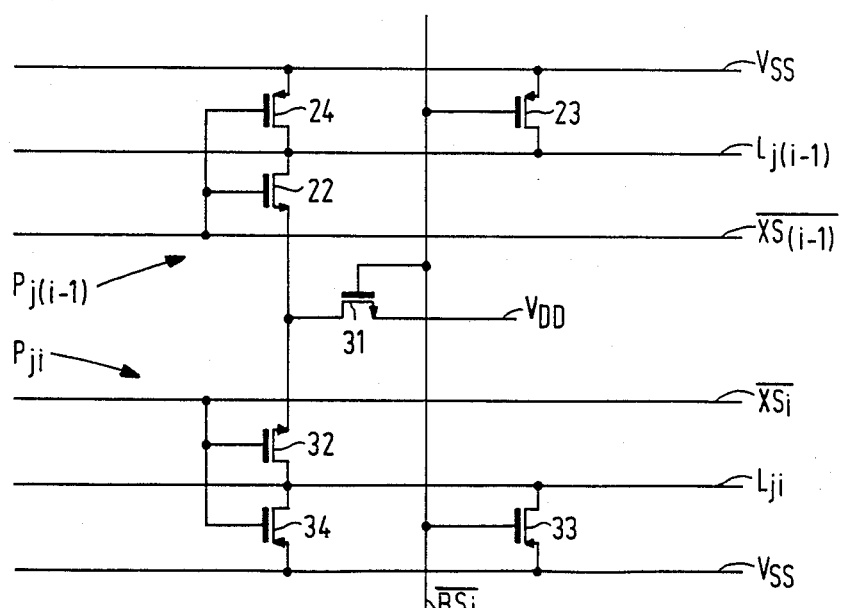
FIG. 4 shows the preferred embodiment of the gate circuit shown in FIG. 3.

It is to be noted that, after each selection of a memory cell and before a next selection of a memory cell in another row within the same memory block, the block selection signal $\overline{BSj}$ is briefly made "high", so that the group selection line Lji is discharged. Because the block selection signal $\overline{BSj}$ is necessarily made "high", the speed of operation of the memory is slightly reduced. It is another drawback that the group selection lines carry a floating potential after having been discharged in this manner so that, after selection of a group selection line L, the non-selected group selection lines can easily pick up the signals on the selected line L in a capacitive manner, thus causing crosstalk. FIG. 4 illustrates how these drawbacks are avoided by creating a controlled discharge path for the associated group selection line L by means of a further transistor in each selection gate P. To this end, in the row selection gate Pji an NMOS transistor 34 is arranged with its main electrodes between the group selection line Lji and the second supply source terminal $V_{SS}$, its gate being connected to the gate of the transistor 32 and to the row selection line $\overline{XSi}$. When a memory cell in row i of block j is selected, the row selection signal $\overline{XSi}$ is low and the transistor 34 is turned off. When a row other than the row i is selected, the row selection signal $\overline{XSi}$ is high so that the transistor 34 is turned on and the group selection line Lji is discharged. The transistor 24 added to the row selection gate Pj(i−1) operates analogously.

Figure 5:
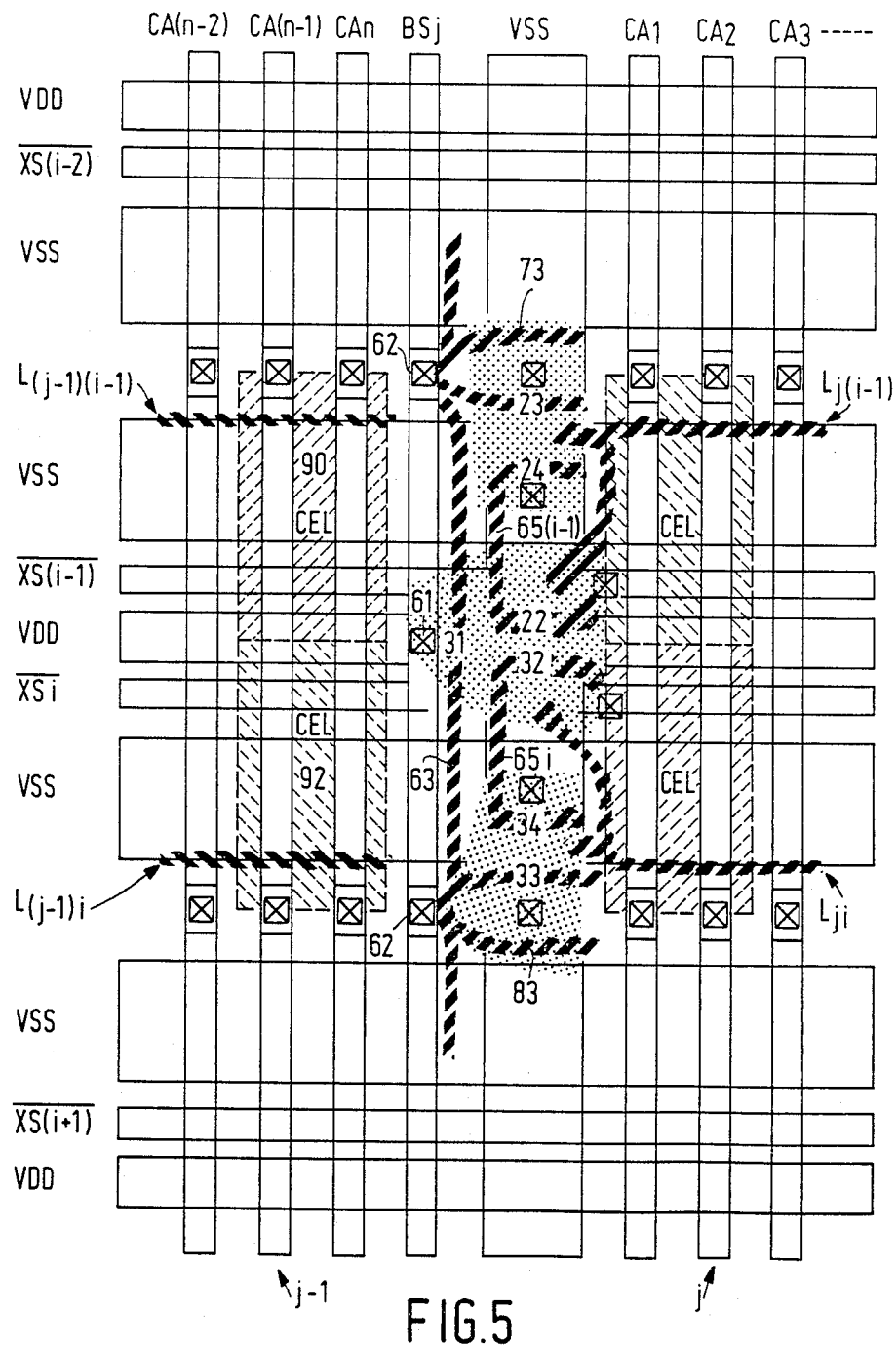
FIG. 5 shows a lay-out of the preferred embodiment of a gate circuit in accordance with the invention.

FIG. 5 diagrammatically shows a lay-out of a part of the memory circuit in accordance with the invention. The memory is constructed by means of a known two-layer metal CMOS technology. The bit lines (column selection lines) CA1, CA2, ... CAn in each block, the block selection line $\overline{BSj}$ and a supply line $V_{SS}$ realized in the second metal layer (extending vertically in the drawing). The row selection lines XS1, ... XS(i−1), $\overline{XSi}$, XS(i+1), ... $\overline{XSm}$ and the supply lines $V_{DD}$ and $V_{SS}$ are realized in the first metal layer (extending horizontally in the drawing) which is isolated from the second metal layer. The first and second metal-layer tracks have been partly omitted in FIG. 5 in order to illustrate the lay-out of the row selection gates Pji. Underneath the first metal layer there are provided polysilicon tracks which form the gates of the various transistors of the row selection gates situated underneath the polysilicon tracks as well as the connections therebetween. These polysilicon tracks are denoted by heavily shaded lines in the drawing. The numbering of these tracks refers to the gates of the correspondingly denoted transistors in FIG. 4. A conductive contact 61 is made between the supply line $V_{DD}$ and the underlying P semiconductor material which forms a first main electrode of the P-channel transistor 31. A regular pattern of conductive contacts 62 is provided between the polysilicon track 63 and the block selection line $\overline{BSj}$. At the area of the contact 61 the polysilicon track 63 forms the gate of the transistor 31. The transistor 31 is a PMOS transistor which is formed in an appropriate N-semiconductor region (denoted by a broken line in the Figure), and so are the PMOS transistors 32 and 22 of the row selection gates Pji and Pj(i−1). The NMOS transistors 33 and 34 of the gate Pji are situated together in a P-semiconductor region as denoted by a dotted area. The same holds good for the transistors 23 and 24 of the gate Pj(i−1). The gates of the transistors 32 and 34 are connected to the row selection line $\overline{XSi}$ via the polysilicon line 65i and the gates of the transistors 22 and 24 are connected to the row selection line XS(i−1) via the polysilicon line 65(i−1). The group selection line Lji is served by the gate Pji and is connected to a main electrode of the transistor 32 and to a main electrode of the transistors 33 and 34. The same holds for the group line Lj(i−1) with respect to the transistors 22, 23 and 24 in the gate Pj(i−1).

In order to utilize the same contacts as much as possible, a part of the lay-out is symmetrical with respect to the contact 61 around which the row selection gates Pj(i−1) and Pji are situated, as well as with respect to the contacts 62, as demonstrated by the polysilicon tracks 73 and 83 which form the gate of an NMOS transistor in the & row selection gate Pj(i−2) and the row selection gate Pj(i+1), respectively. The memory cells 90 and 92 are powered via the same contact 61.

Even though the foregoing description concerns only a subdivision in the direction of the rows (each row selection line is actually replaced by a number of row selection lines in the various blocks), a similar subdivision could be made in the direction of the columns. Identical selection gates could then be used.

What is claimed is:

1. An integrated memory circuit which comprises a plurality of memory blocks with memory cells which are arranged in rows and columns, the memory cells which are arranged in a column being selectable via a column selection line, the memory cells of various memory blocks which are arranged in a row being selectable via a row selection line, a row of memory cells in a memory block being activatable via a logic row selection gate whereto a row selection signal and a block selection signal are applied, characterized in that each said row selection gate comprises at least first, second and third transistors, a first main electrode of said first transistor being connected to a first supply source terminal, a second main electrode of said first transistor being connected to a first main electrode of said second transistor, a second main electrode of said second transistor being connected to a first main electrode of said third transistor, a second main electrode of said third transistor being connected to a second supply source terminal, the gate of said second transistor receiving the row selection signal, said first and third transistors being of different conductivity types and receiving the block selection signal on their gates, a group selection line for activating a row of memory cells in a block being connected to the junction of said second third transistors, two logic row selection gates for two neighboring rows of memory cells within the same memory block having said first transistor in common.

2. A memory as claimed in claim 1, characterized in that each said row selection gate comprises a fourth transistor whose main electrodes are connected to those of the third transistor in the respective row selection gate.

3. A memory circuit as claimed in claim 1 or 2, characterized in that a lay-out of the memory circuit is symmetrical with respect to a straight line through a contact of the first main electrode of the first transistor with the first supply source terminal, said straight line extending transversely with respect to a block selection signal line.

4. A memory circuit as claimed in claim 1 or 2, characterized in that a lay-out of the memory circuit is symmetrical with respect to a straight line through a contact of the gate of a third transistor with a block selection signal line, said straight line extending transversely with respect to a block selection signal line.

5. A memory circuit as claimed in claim 1 or 2, characterized in that in a lay-out of the memory circuit at least one memory cell per row of pairs of neighboring rows of memory cells is fed via the contact of the first main electrode of the first transistor with the first supply source terminal.

6. A memory circuit as claimed in claim 1 or 2, characterized in that each said row selection gate comprises insulated gate field effect transistors, said first and second transistors being of the PMOS type, said third transistor being of the NMOS-type, a gate of said second transistor receiving the inverted row selection signal $\overline{Si}$/ while gates of said first and third transistors receive the inverted block selection signal $\overline{Sj}$/ .

7. A memory circuit as claimed in claim 2, characterized in that the fourth transistor is of the NMOS-type, a gate thereof being connected to the gate of the second transistor in the respective selection gate.

8. A memory circuit as claimed in claim 1 or 2, characterized in that the memory circuit is subdivided into blocks in a row direction as well as in a column direction, a column in a block being activatable via a logic column selection gate whereto a column selection signal and a block selection signal are applied.

9. A memory circuit as claimed in claim 8, characterized in that the logic column selection gates and row selection gates are identical.

* * * * *